(12) United States Patent
Lesso

(10) Patent No.: US 11,748,608 B2
(45) Date of Patent: Sep. 5, 2023

(54) ANALOG NEURAL NETWORK SYSTEMS

(71) Applicant: Cirrus Logic International Semiconductor Ltd., Edinburgh (GB)

(72) Inventor: John Paul Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 420 days.

(21) Appl. No.: 16/844,551

(22) Filed: Apr. 9, 2020

(65) Prior Publication Data

US 2020/0380350 A1 Dec. 3, 2020

Related U.S. Application Data

(60) Provisional application No. 62/853,310, filed on May 28, 2019.

(51) Int. Cl.
*G06N 3/06* (2006.01)
*G06N 3/065* (2023.01)
*G06N 3/04* (2023.01)
*G11C 13/00* (2006.01)

(52) U.S. Cl.
CPC ............... *G06N 3/065* (2023.01); *G06N 3/04* (2013.01); *G11C 13/00* (2013.01)

(58) Field of Classification Search
CPC ............................. G06N 3/0635; G06N 3/04
See application file for complete search history.

(56) References Cited

U.S. PATENT DOCUMENTS

| | | | | |
|---|---|---|---|---|
| 5,140,531 A | * | 8/1992 | Engeler | G06N 3/063 708/3 |
| 6,055,524 A | * | 4/2000 | Cheng | G05B 13/027 706/14 |
| 2020/0118001 A1 | * | 4/2020 | Boybat Kara | G06F 12/04 |

* cited by examiner

*Primary Examiner* — Mohammed A Bashar
(74) *Attorney, Agent, or Firm* — Jackson Walker L.L.P

(57) ABSTRACT

The present disclosure relates to a neural network system comprising: a data input configured to receive an input data signal and analog neural network circuitry having an input coupled with the data input. The analog neural network circuitry is operative to apply a weight to a signal received at its input to generate a weighted output signal. The neural network system further comprises compensation circuitry configured to apply a compensating term to the input data signal to compensate for error in the analog neural network circuitry.

21 Claims, 12 Drawing Sheets

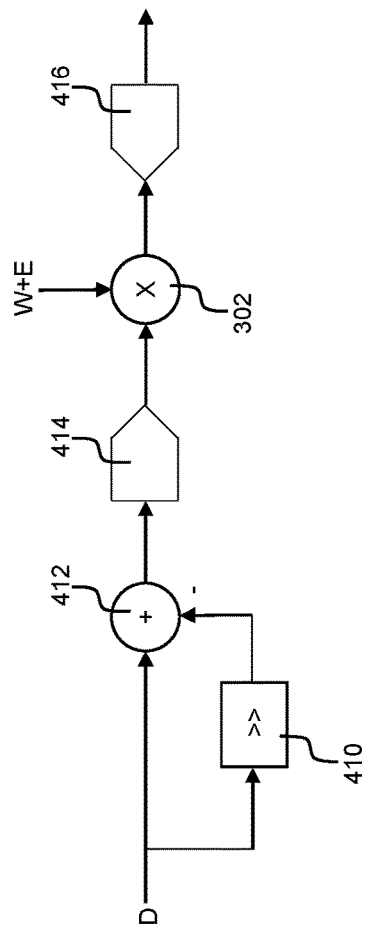

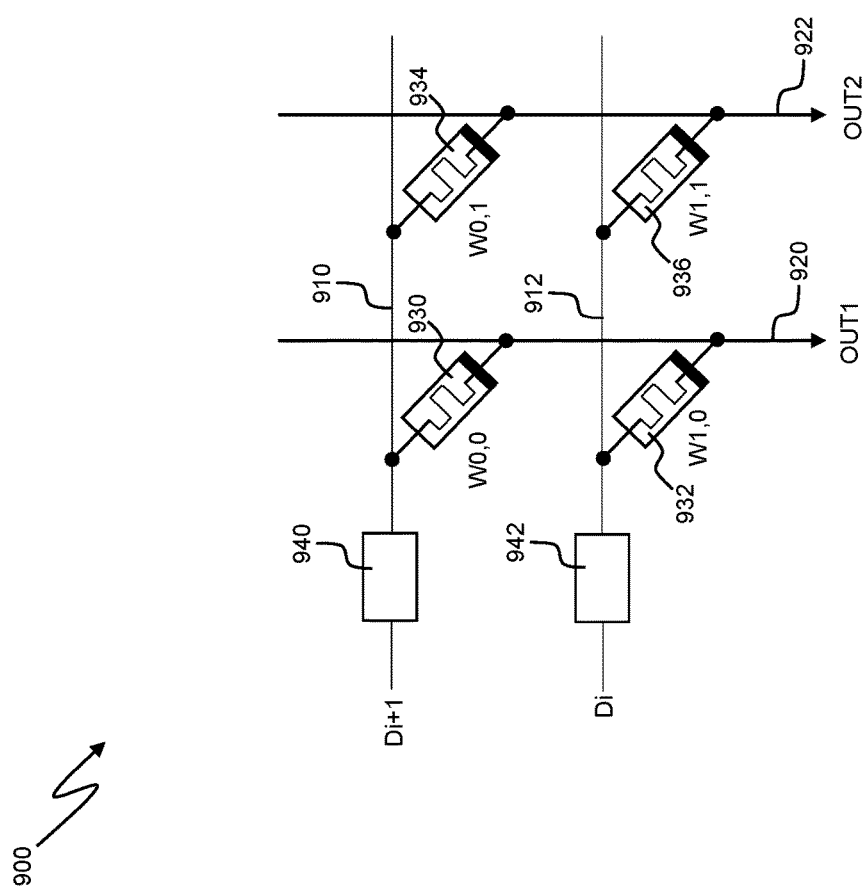

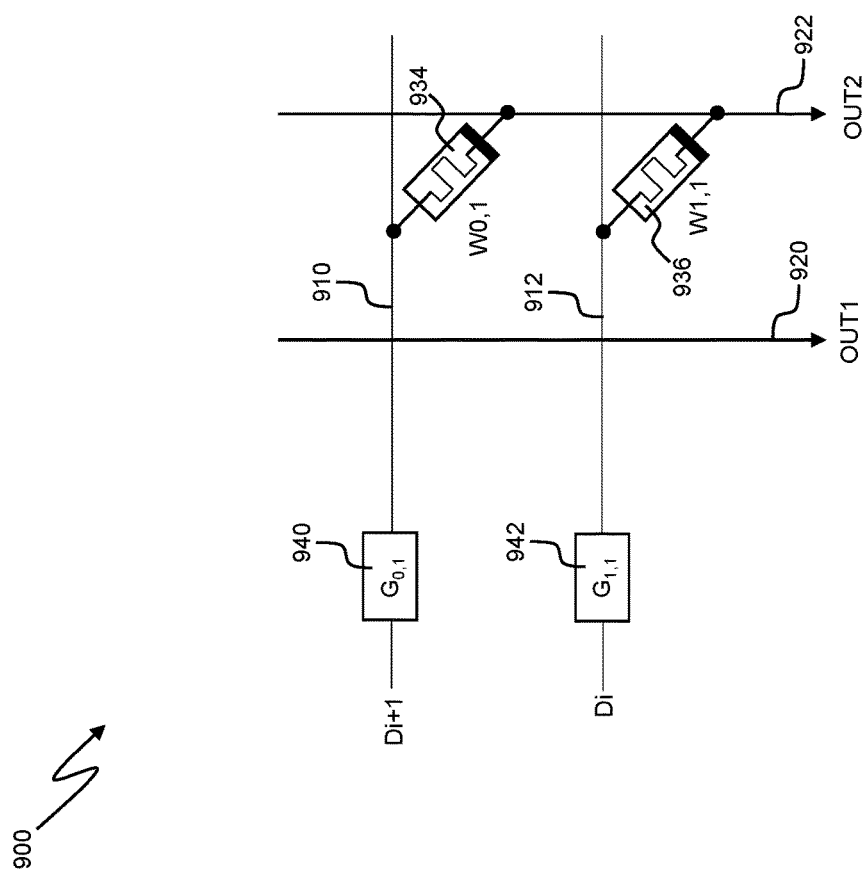

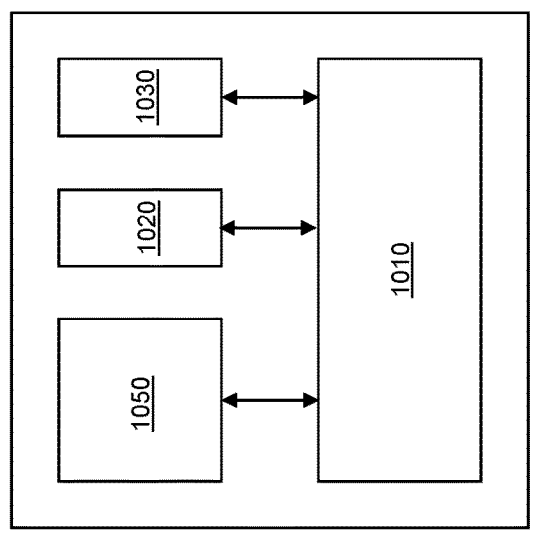
Figure 10

ANALOG NEURAL NETWORK SYSTEMS

FIELD OF THE INVENTION

The present disclosure relates to the field of analog neural network systems.

BACKGROUND

In simplistic terms, an artificial neural network includes an input layer of nodes or neurons, an output layer of nodes or neurons and, optionally, one or more layers (often referred to as "hidden layers") of nodes or neurons intermediate the input layer and the output layer. Each layer is connected to its successor layer by connections between the nodes of the layers that transfer data from a node of a layer to a node of the successor layer.

Each node or neuron of a layer typically has multiple inputs, and a weight is assigned to each input of each node in a learning or training stage. During this learning or training stage, known training data is supplied to a layer of the neural network and individual neurons of the layer assign weights to their inputs based on the task being performed. By comparing the resultant outputs with the known training data, and repeating over a series of iterations, the neural network learns the optimum weights to assign to the inputs of the neurons for the task being performed.

During subsequent use of the neural network, operational input data is supplied to the input layer of the neural network. Data applied to a neuron of the input layer is weighted according to the weights assigned to the inputs of the neuron—i.e. the neuron applies the weight assigned to each of its inputs to the data received at the respective inputs. The neuron sums the weighted input data and performs a non-linear activation function on the sum of the weighted input data to generate an output data value, which is transmitted to one or more neurons of the next layer of the neural network, which may be an output layer or an intermediate layer. The use of a trained neural network to apply weights to operational input data is known as inference.

Traditionally the training and inference stages have been performed by centralised servers or "in the cloud", receiving inputs from and providing resultant outputs to so-called "edge" devices, e.g. mobile phones, tablet computers, "smart" devices etc. However, increasingly there is a drive to provide neural nets for inference locally in such devices, which may receive trained weights from training processes performed remotely.

The trend towards providing local neural nets and inference systems within edge devices is driving requirements for increased flexibility in such neural networks and inference systems.

SUMMARY

According to a first aspect the invention provides a neural network system comprising:
  a data input configured to receive an input data signal;
  analog neural network circuitry having an input coupled with the data input, the analog neural network circuitry being operative to apply a weight to a signal received at its input to generate a weighted output signal; and
  compensation circuitry configured to apply a compensating term to the input data signal to compensate for error in the analog neural network circuitry.

The error in the analog neural network circuitry may be at least partly based on an error in a value of a weight stored by the analog neural network circuitry, and the compensating term applied by the compensation circuitry may be based at least in part upon the weight stored by the analog neural network.

The compensating term applied by the compensation circuitry may be based at least in part upon a measured error in a weight stored by the analog neural network circuitry.

The error in the analog neural network circuitry may be at least partly based on an error in digital to analog conversion circuitry or an error in analog to digital conversion circuitry of the analog neural network circuitry.

The error may comprise a gain error or an offset error, for example.

The input data signal may be a digital signal.

The compensation circuitry may comprise digital circuitry.

The compensation circuitry may be configured to apply the compensating term to the input data signal and to output a compensated signal to the input of the neural network circuitry.

The compensation circuitry may be configured to add the compensating term to the input data signal.

Alternatively, the compensation circuitry may be configured to multiply the input data signal by the compensating term.

The compensation circuitry may comprise:
  a shift register operative to apply a binary shift to the signal received at the data input of the neural network system; and
  an adder operative to add a binary shifted version of the input data signal that is output by the shift register to the input data signal and to output a signal representing the result of the addition to the analog neural network circuitry.

The compensation circuitry may comprise:
  a plurality of shift registers arranged in parallel, each of the plurality of shift registers being operative to apply a different binary shift to the signal received at the data input of the neural network system; and
  one or more adders operative to add binary shifted versions of the input data signal that are output by the plurality of shift registers to the input data signal and to output a signal representing the result of the addition to the analog neural network circuitry.

The compensation circuitry may be configured to apply a compensating term based on a quantisation of an ideal compensating term.

The compensation circuitry may comprise a selector configured to apply the compensating term to the input data signal selectively.

The analog neural network circuitry may comprise a crossbar array comprising:
  a plurality of row electrodes, each of the plurality of row electrodes having a respective input terminal;
  a plurality of column electrodes, each of the plurality of column electrodes having a respective output terminal; and
  a plurality of computation elements, wherein each of the plurality of computation elements is coupled to one of the plurality of row electrodes and to one of the plurality of column electrodes, and is configured to output a signal representative of the product of a value of a signal received at the input terminal of the row electrode to which it is coupled and a weight value associated with the computation element, and wherein the compensation circuitry comprises a plurality of programmable compensation units, each having an output coupled to a respective one of the plurality of row electrodes, each compensation unit being configured to receive a respective data input signal and to apply a respective compensating term to the data input signal.

The neural network system may be configured to generate output signals at the output of the column electrodes sequentially on a per-column electrode basis, and:

the output signals may represent dot products of compensated data signals output by the plurality of programmable compensation units and weight values stored in the computation elements coupled to the column electrode whose output is being calculated;

and the compensation circuitry may be configured to sequentially program the plurality of programmable compensation units with sets of compensating terms, each compensating term being dependent at least in part on a weight stored in a computation element that is coupled to the column electrode whose output is being calculated and to the row electrode to which the respective programmable compensation unit is coupled.

The crossbar array may comprise a plurality of memristive elements or programmable-resistance memory components.

According to a second aspect the invention provides an integrated circuit comprising a neural network system according to the first aspect.

According to a third aspect the invention provides a device comprising an integrated circuit according to second aspect.

The device may be a mobile telephone, a tablet or laptop computer or an Internet of Things (IoT) device, for example.

According to a fourth aspect the invention provides an analog neural network system comprising:

a crossbar array comprising:
   first and second row electrodes, the first row electrode having a first signal input terminal and the second row electrode having a second signal input terminal;
   first and second column electrodes, the first column electrode having a first signal output terminal and second column electrode having a second signal output terminal;
   a first analog computation element coupled to the first row electrode and the first column electrode, the first analog computation element being operative to apply a first weight to a first input signal received at the first signal input terminal;
   a second analog computation element coupled to the second row electrode and the first column electrode the second analog computation element being operative to apply a second weight to a second input signal received at the second signal input terminal;
   a third analog computation element coupled to the first row electrode and the second column electrode, the third analog computation element being operative to apply a third weight to a third input signal received at the first signal input terminal;
   a fourth analog computation element coupled to the second row electrode and the second column electrode, the fourth analog computation element being operative to apply a fourth weight to a fourth input signal received at the second signal input terminal;
wherein the analog neural network system further comprises:

a first configurable compensation unit having an input for receiving a first input data signal and an output coupled to the first signal input terminal; and a second configurable compensation unit having an input for receiving a second input data signal and an output coupled to the second signal input terminal;

and wherein the analog neural network system is operative to:

program the first and second configurable compensation units with respective first and second compensation terms and generate a first output signal at the first signal output terminal, the first output signal being based on:

the product of a compensated data input signal output by the first configurable compensation unit and a weight value stored in the first analog computation element; and the product of a compensated data input signal output by the second configurable compensation unit and a weight value stored in the second analog computation element;

and subsequently program the first and second configurable compensation units with respective third and fourth compensation terms and generate a second output signal at the second signal output terminal, the second output signal being based on:

the product of a compensated data input signal output by the first configurable compensation unit and a weight value stored in the third analog computation element; and the product of a compensated data input signal output by the second configurable compensation unit and a weight value stored in the fourth analog computation element.

BRIEF DESCRIPTION OF THE DRAWINGS

Embodiments of the invention will now be described, strictly by way of example only, with reference to the accompanying drawings, of which:

FIG. 4 is a schematic representation of a system for applying a compensating term to a digital input data signal to which a weight stored in a computation element is applied;

FIGS. 9A-9C illustrate a sequence for applying weight dependent compensation to input signals to an analog crossbar array; and FIG. 10 is a schematic representation of a device including an analog neural network system.

DETAILED DESCRIPTION

Figure 1:
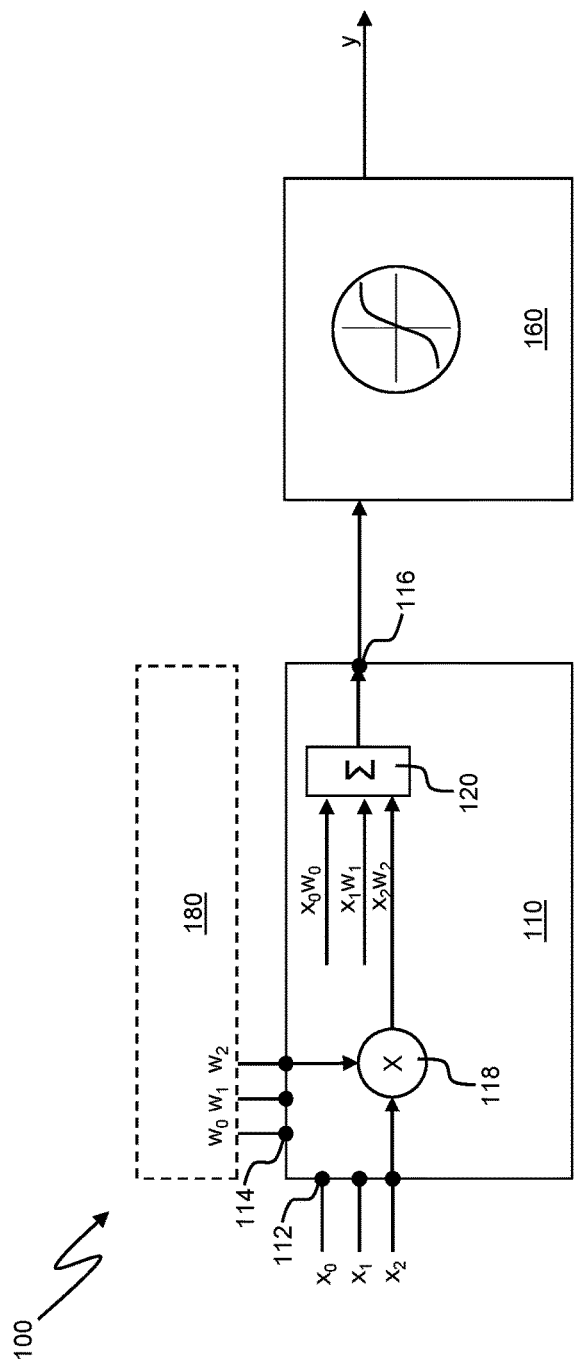
FIG. 1 is a simplified schematic representation of a neuron for an artificial neural network.

Referring first to FIG. 1, a neuron for an artificial neural network (ANN) is shown generally at 100, and comprises a dot product engine 110 and an activation function unit 160.

A neuron of a neural network can be modelled, in part, by a vector multiplication operation, multiplying a vector of input values (representing the inputs to the neuron) by a vector of weights or coefficients (representing the weights applied by the neuron to its inputs) to generate an intermediate output value (representing the sum of the results of the multiplication of each input value with the corresponding weight value, i.e. the dot product of the input vector and the weight vector). This intermediate output value is then subjected to an activation function to provide the neuron output.

The dot product engine 110 of FIG. 1 is configured to calculate the dot product of a plurality (in this example three) of input signals and a plurality (in this example three) of weight signals, by multiplying each input with a corresponding weight and summing the results of the multiplication to generate a single output value. Thus the dot product engine implements part of the functionality of a neuron of a neural network.

To this end, the dot product engine 110 has a plurality of parallel data input terminals 112 for receiving input data signals, a plurality of weight input terminals 114 for receiving weight data signals, and a data output terminal 116 for outputting a result of a calculation of the dot product of the input data signals and the weight data signals.

The dot product engine 110 further includes a plurality of computation elements 118 (of which, for the sake of clarity, only one is shown in FIG. 1) and a summation unit 120. The computation elements 118 may be digital computation elements or analog computation elements. In the case where the computation elements 118 are digital computation elements, the dot product engine 110 may be referred to as a digital dot product engine, whereas if the computation elements 118 are analog computation elements the dot product engine 110 may be referred to as an analog dot product engine.

In one example, the computation elements 118 may be based on memristors, in which case the weight data signals received by the dot product engine 110 via the weight input terminals 114 may be, for example, signals that are used to program the computation elements 118 with weight data. Alternatively, the computation elements may comprise other forms of non-volatile analog memory elements, for example based on floating-gate structures, or may comprise non-volatile digital memory elements used to digitally configure analog elements, for example the values of switched capacitors or the values of current sources.

As used herein the term memristor or memristive element may refer to an electronic element that has a variable resistance which can be controllably varied and which has some memory such that a particular resistance state persists in the absence of applied power. Binary memristors have been proposed, for instance based on MRAM (Magnetoresistive random-access memory) or ReRAM (Resistive random-access memory) memory, that can exhibit either a high resistance state or a low resistance state and can be selectively programmed to operate in the desired state, for instance by applying suitable programming voltages. An individual MRAM or ReRAM memory or memristor may thus be used as binary memristor and can be seen as a type of programmable memory.

However there may be other types of programmable-resistance memory component that can be selectively controlled to adopt one of two different states, where each state exhibits a different resistance or conductance, and the selected state persists once programmed. For instance programmable-resistance memory components could comprise or be based on flash-based memory e.g. floating-gate technologies such as ESF3, charge-trap technologies such as Silicon-Oxide-Nitride-Oxide-Silicon (SONOS) technologies, fuses (polysilicon or metal), carbon nanotubes or some non-memristive MRAM technologies such as spintronic technology, or phase-change memory. In general, any suitable programmable-resistance memory component could be used a binary memory component in place of at least of the binary memristors or computation elements described in the various embodiments.

Where the computation elements 118 are digital computation elements, the weight data signals may be received from a memory 180, external to the dot product engine 110, which stores weight values, though the weight data may also be stored locally in the digital computation element.

In use of the neuron 100, input data signals $x_0$, $x_1$, $x_2$ are received at the data input terminals 112 of the dot product engine 110. A computation element 118 of the dot product engine 110 multiplies each received input signal $x_0$, $x_1$, $x_2$ with a corresponding weight $w_0$, $w_1$, $w_2$ and outputs an output signal representing the result of the multiplication to the summation unit 120. For example, as shown in FIG. 1, a computation element 118 of the dot product engine 110 calculates the product of input signal $x_2$ and weight $w_2$ and outputs a signal representing the result $x_2w_2$ of this multiplication to the summation unit 120.

The summation unit 120 sums the results $x_0w_0$, $x_1w_1$, $x_2w_2$ of the multiplication operations performed by the computation elements 118 and outputs a dot product output signal representing the sum of the multiplication operations to the non-linear activation function 160, via the output terminal 116 of the dot product engine 110.

The non-linear activation function 160 performs a non-linear activation function on the dot product output signal. For example, the non-linear activation function unit 160 may compare the magnitude of the dot product output signal to a threshold, and output an output signal y having a magnitude equal to that of the dot product output signal if the magnitude of the dot product output signal meets or exceeds the threshold. If the magnitude of the dot product output signal is below the threshold, the non-linear activation function unit 160 may output a zero or a signal having some other constant magnitude. It will be understood that this is a simple example of a non-linear activation function, and that alternative non-linear functions may be used as required by the particular circumstances and application of the net in which the neuron 100 is used. For example, the non-linear activation function may include or be based on a non-linear function such as a cube, square, ReLU, sigmoid, tan h. Other suitable non-linear functions will be familiar to those skilled in the art.

Figure 2:
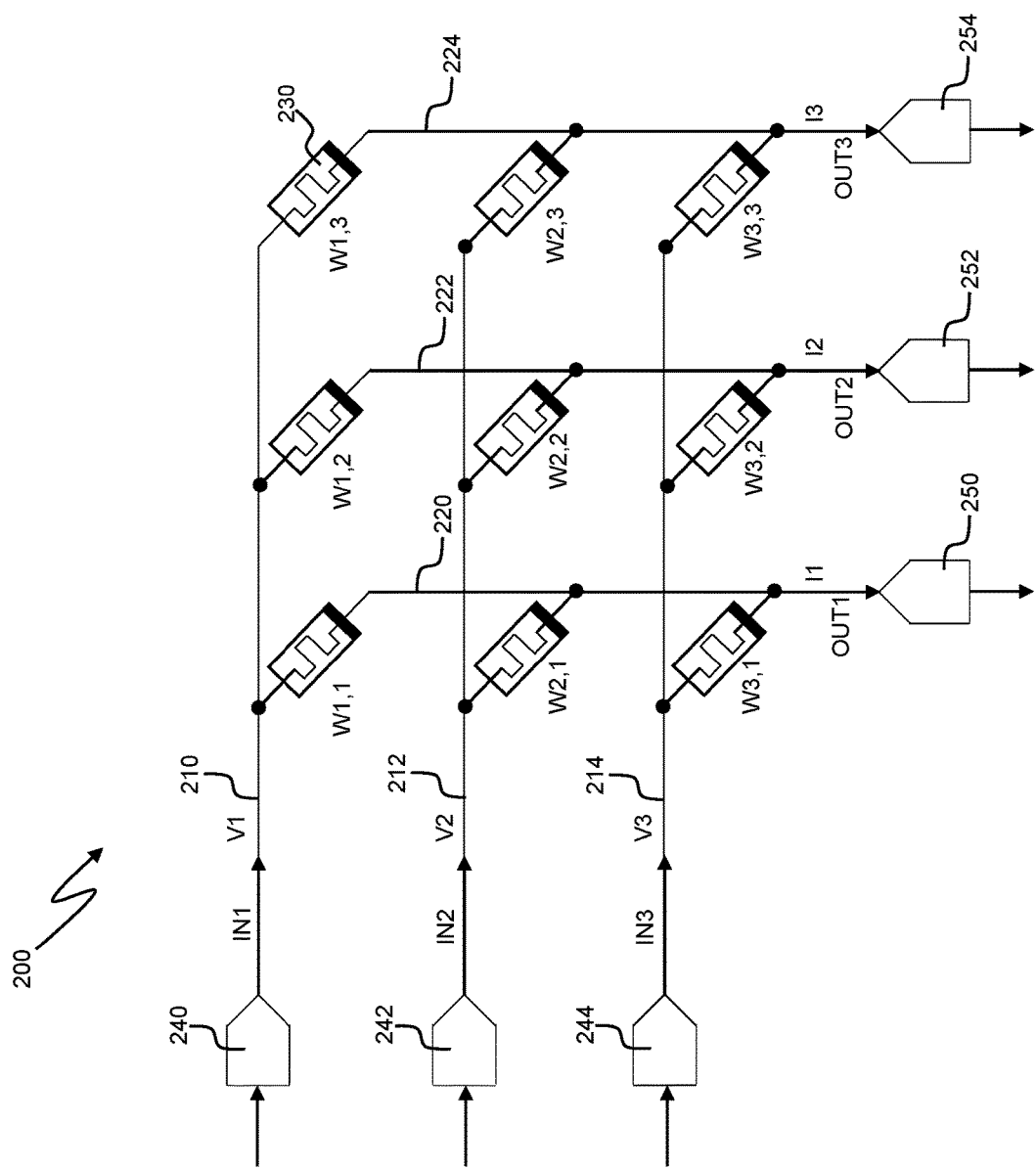
FIG. 2 is a simplified schematic representation of an analog crossbar array for use in a neuron of an artificial neural network.

FIG. 2 is a schematic representation of a crossbar array 200 for use in an analog implementation of a neuron for an artificial neural network, e.g. the neuron 100 of FIG. 1. In this example the crossbar array uses memristive elements as combined storage and computation elements (referred to hereinafter as computation elements), but it will be appreciated by those skilled in the art that alternative computation elements could be used.

The crossbar array includes a plurality (in this example three) of first electrodes (e.g. row electrodes) 210, 212, 214 and a plurality (in this example three) of second electrodes (e.g. column electrodes) 220, 222, 224 arranged to overlap with the plurality of row electrodes 210, 212, 214. Thus, the example crossbar array illustrated in FIG. 2 is a 3×3 crossbar array, though of course crossbar arrays of different dimensions are possible. Each of the row electrodes 210, 212, 214 is coupled to each of the column electrodes 220, 222, 224 via a respective computation element. In the examples described herein the computation elements are memristive elements, but it is to be appreciated that the principles described in the present disclosure are equally applicable to any combined computation and storage element, such as the programmable-resistance memory components discussed above.

To programme the crossbar array 200, programming voltage pulses may be applied to the column electrodes 220, 222, 224 while a write voltage is applied to one of the row electrodes (e.g. row electrode 210) so as to create a resultant voltage to program the resistance state of each of the memristive elements 230 of that row. The other row electrodes (e.g. row electrodes 212, 214) may be held at a voltage level such that the resultant voltage experienced by the memristive elements of these other rows is insufficient to change the resistance state of the memristive element. The crossbar array 200 may be programmed in this way, row by row. Once programmed, the memory can be read out, row by row, by applying a read pulse to the relevant row and monitoring each column to determine the resistance state of the relevant memristive elements.

Once suitably programmed the crossbar array 200 can be used to perform computation operations.

The row electrodes 210, 212, 214 are arranged as inputs IN1, IN2, IN3 and the column electrodes 220, 222, 224 are arranged as outputs OUT1, OUT2, OUT3. It will be understood however that the principle could apply to a different number of inputs and/or outputs and the number of inputs could be different to the number of outputs. Each input is connected to each output via a respective memristive element 230.

In the example of FIG. 2, input data may be provided to each input of the array as a respective voltage level, V1, V2, V3. Each output will provide a respective output current I1, I2, I3. A given output will receive a contribution of current from each input, where the respective current contribution depends on the respective voltage at that input and the resistance state of the relevant memristive element. Simplistically, if each output were considered to be held at ground or be a virtual earth, the current contribution at a given output k from a given input j will be equal to the voltage $V_j$ at input j multiplied by the conductance $G_{j,k}$ of the memristive element linking input j to output k (and where the conductance $G_{j,k}$ is the inverse of the resistance of the relevant memristive element, i.e. $G_{j,k}=1/R_{j,k}$ where $R_{j,k}$ is the resistance of the relevant memristive element). In this example a given output thus receives a contribution to the overall current output current from each input, where the current contribution is equal to the product of the voltage at that input and the conductance of the relevant memristive element. The overall current output may be regarded as representing the dot product $G_k \cdot V = \Sigma\, G_{j,k} \cdot V_j$ of a vector V comprising the set of voltages $V_j$ with a vector $G_k$ comprising the set of conductances $\{G_{j,k}; j=1 \ldots \}$.

The conductance $G_{j,k}$ of the memristive element, i.e. $1/R_{j,k}$, can thus be seen as a weight $W_{j,k}$ applied to the data at input j for output k. If suitable data is applied simultaneously to multiple inputs, the output current at a given output is a sum of the weighted contributions from the various inputs. This output current could be processed as an analogue current variable or converted into a corresponding voltage. It can therefore be seen that the crossbar array illustrated in FIG. 2 performs simultaneous dot product calculations for the various input data values with stored weight values, without requiring a separate memory read process and automatically provides a sum of the relevant weighted input values for a given output.

One issue that can arise with crossbar arrays of the kind illustrated in FIG. 2 is that there can be variations in the weights stored in the memristive elements 230 (i.e. the programmed conductances of the memristive elements 230), due to factors such as variations in the memristive elements arising from manufacturing processes. Thus, two different memristive elements 230 that are both programmed to exhibit a high resistance state may nevertheless have different conductances when programmed, for example. As the output current at each output of the crossbar array 200 depends partly upon the conductances of the memristive elements 230 coupled to that output, such differences between memristive elements 230 can give rise to undesirable errors in the output current such that the output of the crossbar array does not correctly reflect the desired dot product.

In some applications input data on which computation operations are to be performed by the crossbar array 200 may be provided as digital signals, and digital output signals representing the results of the computations performed by the crossbar array may be desired. Thus, a system in which the crossbar array 200 is employed may include a plurality of digital to analog converters (DACs) 240, 242, 244, each configured to receive a digital input data signal and to output an analog representation of the received digital input signal to an input IN1, IN2, IN3 of the crossbar array 200. Each output OUT1, OUT2, OUT3 of the crossbar array 200 may be coupled to one of a plurality of analog to digital converters (ADC) 250, 252, 254, each ADC being configured to convert an analog output signal of the crossbar array 200 into a digital representation of the analog output signal.

In such systems, the DACs 240, 242, 244 and/or ADCs 250, 252, 254 may introduce error into the computation, for example as a result of gain error or offset error in the DACs and/or ADCs.

Aspects of the present disclosure aim to address this problem by applying compensation to data signals input to an analog crossbar array in order to compensate for error introduced as a result of variation in the computation elements of the crossbar array or as a result of error such as gain error or offset error in DACs or ADCs of a system incorporating the crossbar array.

Figure 3A:
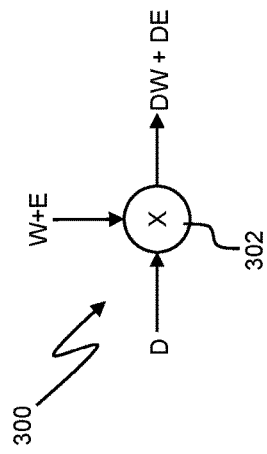
FIGS. 3a-3c are simplified schematic diagrams illustrating the principle of applying compensation to data signals input to an analog neural network system in order to compensate for error introduced as a result of variation in the computation elements of the analog neural network system.
Figure 3B:
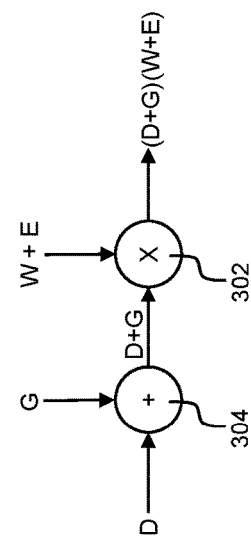
Figure 3C:
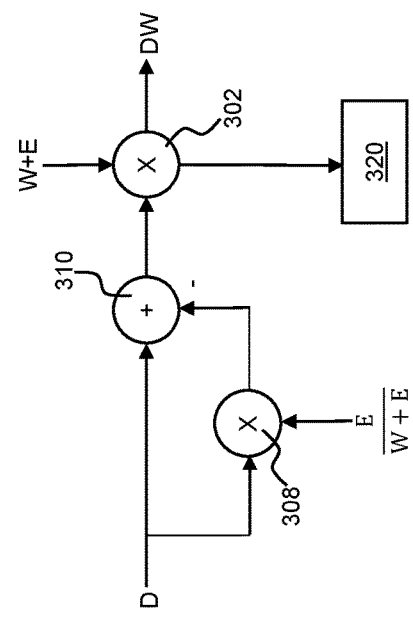

This principle is illustrated in FIGS. 3a-3c.

In FIG. 3a a programming signal is applied to a computation element 302 of a neural network system 300 with the intention of programming the computation element 302 with a weight of value W. However, the weight value actually stored by the computation element 302 includes an error E, i.e. the value of the weight actually stored by the computation element is (W+E). In use of the system 300 of FIG. 3a a data input signal representing a data value D is received at a data input terminal of the computation element 302, and the data value D is multiplied by the stored weight value (W+E), giving rise to an output signal representing a value D(W+E)=DW+DE at an output of the computation element 302. Thus the value represented by the signal output by the computation element 302 includes an error equal to DE.

FIG. 3b is a schematic representation of a modified system that could be used to compensate for the error E in the stored weight value and thus eliminate the error DE in the signal output by the computation element 302. In the system illustrated in FIG. 3b the input data signal D is received by adder circuitry 304, which adds a compensating term G to the input data signal D and outputs a combined signal D+G to the computation element 302. This combined signal D+G is multiplied by the stored weight value (W+E), giving rise to an output signal (D+G)(W+E) at the output of the computation element 302.

The compensating term G should be selected such that the value represented by the output signal at the output of the computation element 302 is equal to the product of the weight value W and the input data value D, i.e.:

$$DW=(D+G)(W+E)$$

Solving for G:

$$G = \frac{-DE}{W+E}.$$

Thus, the compensating term G depends upon the stored weight value W and upon the error value E.

FIG. 3c is a schematic representation of a system for applying such a compensating term to the input data signal representing the data value D.

In the system illustrated in FIG. 3c an input data signal D, received at an input terminal of the system, is transmitted to multiplier circuitry 308, which multiplies the input data value D by a term $$\frac{E}{W+E}$$

and outputs a signal representing the value $$\frac{DE}{W+E}$$

to subtractor circuitry 310. The subtractor circuitry 310 subtracts the value $$\frac{DE}{W+E}$$

from the input data signal D and outputs a signal representing the value $$D - \frac{DE}{W+E}$$

to the computation element 302. The computation element 302 multiplies the value $$D - \frac{DE}{W+E}$$

by the stored weight value (W+E) and outputs a signal DW, which is equal to the product of the weight value W and the input data value D.

As will be appreciated, in order for this approach to compensate successfully for the error E in the stored weight, the error value E must be known. The error value E can be calculated following writing of the weight to the computation element 302 by performing a read operation to read the stored weight value (W+E), and comparing the stored weight value (W+E) with the weight value W that it was intended would be stored. A calibration module 320 may be provided to perform the calculation of the value of the error E and subsequently to calculate the correction term G in the manner described above. It will be understood that the correction term G may be locally stored.

The input data signal D may be a digital signal. FIG. 4 is a schematic representation of a system 400 for applying a compensating term to a digital input data signal to which a weight stored in a computation element 302 is applied.

As discussed above, in order to compensate for the error E in the weight value stored in the computation element 302, a compensating term G should be selected such that value represented by the output signal at the output of the computation element 302 is equal to the product of the weight value W and the input data value D. For completely accurate compensation, an ideal compensating term G should be equal to $$\frac{-DE}{W+E}.$$

However, the compensating term G can be approximated by a suitable binary right shift of the input data signal D, such that the signal output by the computation element represents an acceptable approximation of the product DW of the weight value W and the input data value D.

Thus, the system 400 of FIG. 4 includes shift register circuitry 410 which is operative to receive a digital input data signal D and to perform a k-bit binary right shift on the received digital input data signal D. An output of the shift register circuitry 410 is coupled to an input of subtractor circuitry 412, which has another input at which the digital input data signal D is received. Thus, the subtractor circuitry 412 is operative to subtract a k-bit shifted version of the input digital data signal D from the input digital data signal D and to output a compensated digital signal representative of the result of this subtraction to a computation element 302. This compensated digital signal is output to digital to analog converter (DAC) circuitry 414, which converts the compensated digital signal to an analog signal which is output to the computation element 302.

The computation element 302 multiplies the analog signal output by the DAC circuitry 414 by the weight value (W+E) stored in the computation element 302 to generate an analog output signal that represents an approximation of the product DW of the weight value W and the input data value D. The analog signal output by the computation element 302 may be converted into a digital signal by analog to digital converter (ADC) circuitry 416.

Figure 5:
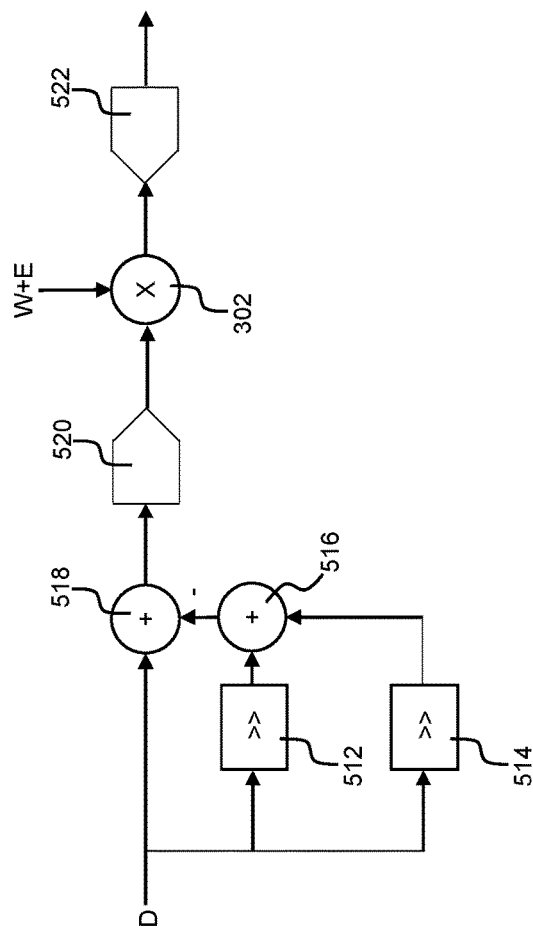
FIG. 5 is a schematic representation of an alternative system for applying a compensating term to a digital input data signal to which a weight stored in a computation element is applied.

FIG. 5 is a schematic representation of an alternative system 500 for applying a compensating term to a digital input data signal to which a weight stored in a computation element 302 is applied.

The system 500 of FIG. 5 includes first shift register circuitry 512, which is operative to receive a digital input data signal D and to perform a binary right shift on the received digital input data signal D, and second shift register circuitry 514 which is also operative to receive the digital input data signal D and to perform a binary right shift on the received digital input data signal D.

Outputs of the first and second shift register circuitry 512, 514 are coupled to inputs of first adder circuitry 516, which adds the binary shifted versions of the input data signal D that are output by the first and second shift register circuitry 512, 514 and outputs a signal representing the result of this addition to a first input of subtractor circuitry 518. The subtractor circuitry 518 receives the input digital data signal D at a second input, subtracts the signal received from the adder circuitry 516 from the input digital data signal D and outputs a compensated digital signal representing the result of this subtraction to DAC circuitry 520. The DAC circuitry 520 converts the compensated digital signal into an analog signal, which is output by the DAC circuitry 520 to the computation element 302. The computation element 302 multiplies the analog signal output by the DAC circuitry 520 by the weight (W+E) stored in the computation element 302 to generate an analog output signal that represents an approximation of the product DW of the weight value W and the input data value D. The analog signal output by the computation element 302 may be converted into a digital signal by analog to digital converter (ADC) circuitry 522.

The use of the first and second shift register circuitry 512, 514 improves the accuracy of the approximation output by the computation element 302, as compared to that of the approximation output by the computation element 302 of the system 400 of FIG. 4.

The number of bits by which the input data signal is shifted by the first and second shift registers 512, 514 may be selected so as to balance a desired level of accuracy with the number of bits of memory available to store the shifted versions of the input data signal D. The binary right shift performed by the second shift register circuitry 514 may be by the same number of bits as the binary right shift performed by the first shift register circuitry 512, or alternatively the first and second shift register circuitry 512, 514 may be configured to perform different binary shifts on the received input data D.

In further embodiments more than two shift registers may be provided, each shift register being configured to apply a binary right shift to the input data signal D. The binary shifted signals output by the shift registers are added by one or more adders and the result of this addition is subtracted from the input data signal, with the result of this subtraction being output (via appropriate DAC circuitry) to the computation element 302 for multiplication by the stored weight value (W+E) to generate an approximation of the product DW of the weight value W and the input data value D.

Figure 6:
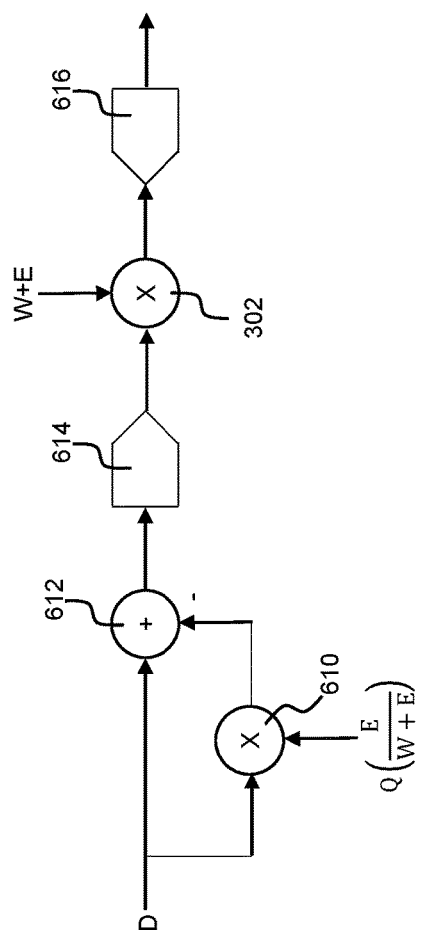
FIG. 6 is a schematic representation of a further alternative system for selectively applying a compensating term to a digital input data signal that is multiplied by a weight stored in a computation element.

More generally, the accuracy of the approximation of the product DW can be varied by applying a compensating term based on a quantisation of a portion of the ideal compensating term calculated above as $$G = \frac{-DE}{W+E}$$

to the input data signal. FIG. 6 is a schematic representation of a system 600 for applying such as compensating term to an input data signal.

In the system 600 illustrated in FIG. 6 an input data signal D, received at an input terminal of the system 600, is transmitted to multiplier circuitry 610, which multiplies the input data signal D by a compensating term $$Q\left(\frac{E}{W+E}\right),$$

which is a quantisation of the term $$\frac{E}{W+E}$$

(and is this a quantisation or a portion of the ideal compensating term G). The multiplier 610 outputs a signal $$DQ\left(\frac{E}{W+E}\right)$$

to subtractor circuitry 612, which subtracts the signal $$DQ\left(\frac{E}{W+E}\right)$$

from the input data signal d and outputs a digital compensated signal $$D - DQ\left(\frac{E}{W+E}\right)$$

to DAC circuitry 614, which converts the digital compensated signal into an analog signal which is output to the computation element 302. The computation element 302 multiplies the analog representation of the signal $$D - DQ\left(\frac{E}{W+E}\right)$$

output by the DAC circuitry 614 by the stored weight value (W+E) and outputs an analog signal DW, which is an approximation of the product of the weight W and the input data D, with the accuracy of the approximation being dependent upon the quantisation level applied to the term $$\frac{E}{W+E}.$$

The analog signal output by the computation element 302 may be converted into a digital signal by analog to digital converter (ADC) circuitry 616.

In some embodiments compensation may be selectively applied to the input data signal, e.g. the compensation may only be applied in situations in which applying the compensation to the digital input data signal D will result in an improvement in the approximation output by the computation element 302.

Figure 7:
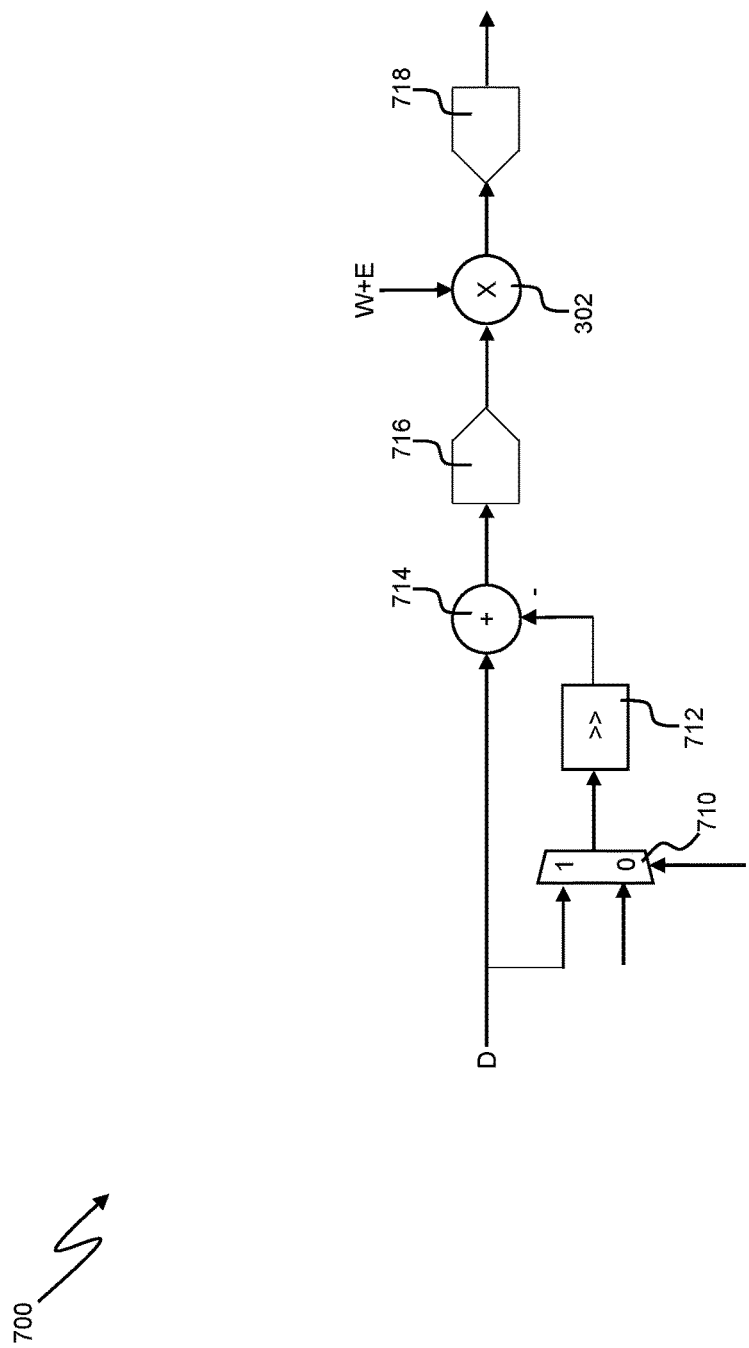
FIG. 7 is a schematic representation of a further alternative system for selectively applying a compensating term to a digital input data signal that is multiplied by a weight stored in a computation element.

FIG. 7 is a schematic representation of a system 700 for selectively applying a compensating term to a digital input data signal that is multiplied by a weight stored in a computation element 302.

The system 700 includes multiplexer circuitry 710 having a first input coupled to a data input of the system 700 which receives a digital data input signal D. A second input of the multiplexer circuitry 710 receives a binary zero (e.g. is coupled to ground). An output of the multiplexer circuitry 710 is coupled to an input of shift register circuitry 712. A control input of the multiplexer circuitry 710 receives a control signal to control which of its inputs is coupled to its output. Thus, the output of the multiplexer circuitry 710 may be either the received digital data input signal or zero.

The shift register circuitry 712 is operative to receive a digital signal output by the multiplexer circuitry 710 and to perform a k-bit binary right shift on the received digital signal. An output of the shift register circuitry 712 is coupled to an input of subtractor circuitry 714, which has another input at which a digital input data signal D is received. Thus, the subtractor circuitry 714 is operative to subtract a k-bit shifted version of the signal output by the multiplexer circuitry 710 from the input digital data signal D and to output a digital compensated signal representative of the result of this subtraction to DAC circuitry 716. The DAC circuitry 716 converts the digital compensated signal into an analog signal which is output to the computation element 302. The computation element 302 multiplies the analog signal output by the DAC circuitry 716 by the weight value (W+E) stored in the computation element 302 to generate an analog output signal that approximates the product DW of the weight W and the input data D. The analog signal output by the computation element 302 may be converted into a digital signal by analog to digital converter (ADC) circuitry 718.

The system 700 may be configured to determine if the data compensation results in a more accurate or less accurate output. For example, the system may determine that the error present in the system is so small as to not require compensation, and/or quantisation introduced by the data compensation may provide a less accurate result.

When it is determined that applying a compensating term to the digital input data signal D would result in a more accurate approximation of the product DW at the output of the system 700, a control signal is transmitted to the multiplexer circuitry 710 via its control input to cause the multiplexer circuitry 710 to couple its output to its first input such that the digital input data signal received at the first input of the multiplexer circuitry 710 is output by the multiplexer circuitry 710 to the shift register circuitry 712. The shift register circuitry 712 thus applies a binary shift to the received input data signal D and outputs a binary shifted version of the input digital data signal to the subtractor circuitry 714, which subtracts the binary shifted version of the input digital data signal from the input digital data signal D and outputs the result of this subtraction to the DAC circuitry 716, which in turn outputs an analog signal representing the result of the subtraction to the computation element 302.

When it is determined that applying a compensating term to the digital input data signal D would not result in a more accurate approximation of the product DW at the output of the system 700, a control signal is transmitted to the multiplexer circuitry 710 via its control input to cause the multiplexer circuitry 710 to couple its output to its second input such that the multiplexer circuitry 710 outputs a binary zero to the shift register circuitry 712. The shift register circuitry 712 in turn outputs a binary zero to the subtractor circuitry 714, which therefore outputs an unmodified version of the input digital data signal D to the DAC circuitry 716, which in turn outputs an analog signal representing an unmodified version of the input digital data signal D to the computation element 302.

Although the system 700 of FIG. 7 is shown as comprising a single shift register 712, it is to be appreciated that a plurality of shift registers and associated adders may be provided in place of the shift register 712, as described above with reference to the system 500 of FIG. 5. Alternatively, the shift register 712 could be replaced by a multiplier configured to multiply the signal output by the multiplexer 710 by a correction term $$Q\left(\frac{E}{W+E}\right),$$

as described above with reference to the system 600 of FIG. 6.

The systems described above with reference to FIGS. 3-7 all apply a compensating term to the digital input data signal in an additive manner, by adding the compensating term G to the digital input data signal D prior to the multiplication of the digital input data signal D by the stored weight value (W+E). A compensating term can also be applied to the digital input data in a multiplicative manner, by multiplying the digital input data signal by the compensating term prior to the multiplication of the digital input data signal by the stored weight value, as will now be described with reference to FIG. 8.

Figure 8:
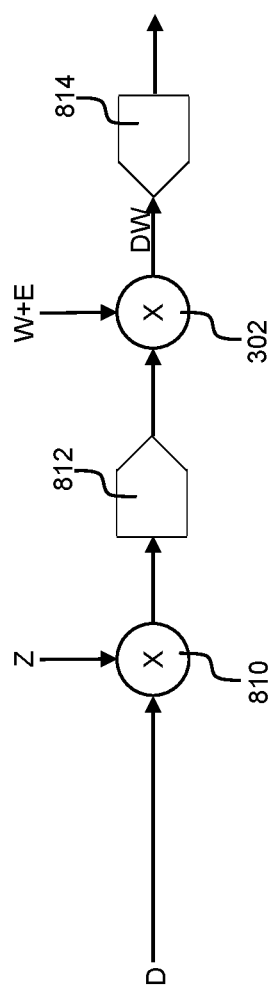
FIG. 8 is a schematic representation of a system 800 for multiplicatively applying a compensating term to a digital input data signal.

FIG. 8 is a schematic representation of a system 800 for multiplicatively applying a compensating term to a digital input data signal. The system 800 includes multiplier circuitry 810 configured to receive a digital input data signal D and a compensating term Z and to output a digital compensated signal representing the product DZ of the input data signal D and the compensating term to DAC circuitry 812. The DAC circuitry 812 converts the digital compensated signal into an analog signal and outputs the analog signal to a computation element 302. The computation element 302 multiplies the signal output by the DAC circuitry 812 by the stored weight value (W+E) to generate an analog output signal representing the product DW of the weight W and the input data D. The analog signal output by the computation element 302 may be converted into a digital signal by analog to digital converter (ADC) circuitry 814.

The compensating term Z should be selected such that the output signal at the output of the computation element 302 is equal to the product of the weight W and the input data D, i.e.:

$$DW = DZ(W+E)$$

Solving for Z:

$$Z = \frac{W}{W+E} = \frac{1}{1+\frac{E}{W}}.$$

Thus, the compensating term Z is dependent upon the weight W.

As will be appreciated, in order for this approach to compensate successfully for the error E in the stored weight, the error E must be known. The error E can be calculated following writing of the weight to the computation element 302 by performing a read operation to read the stored weight value (W+E), and comparing the stored weight value (W+E) with the weight W that it was intended would be stored.

Because the error E will typically be much smaller than the weight W, $$\frac{E}{W}$$

is significantly less than 1, and so the compensating term Z can be approximated as $$1 - \frac{E}{W},$$

and this approximation of the compensating term Z can be applied to the digital input data signal to compensate for the error E in the stored weight data so as to generate an acceptable approximation of the product DW at the output of the computation element 302.

Figure 9B:
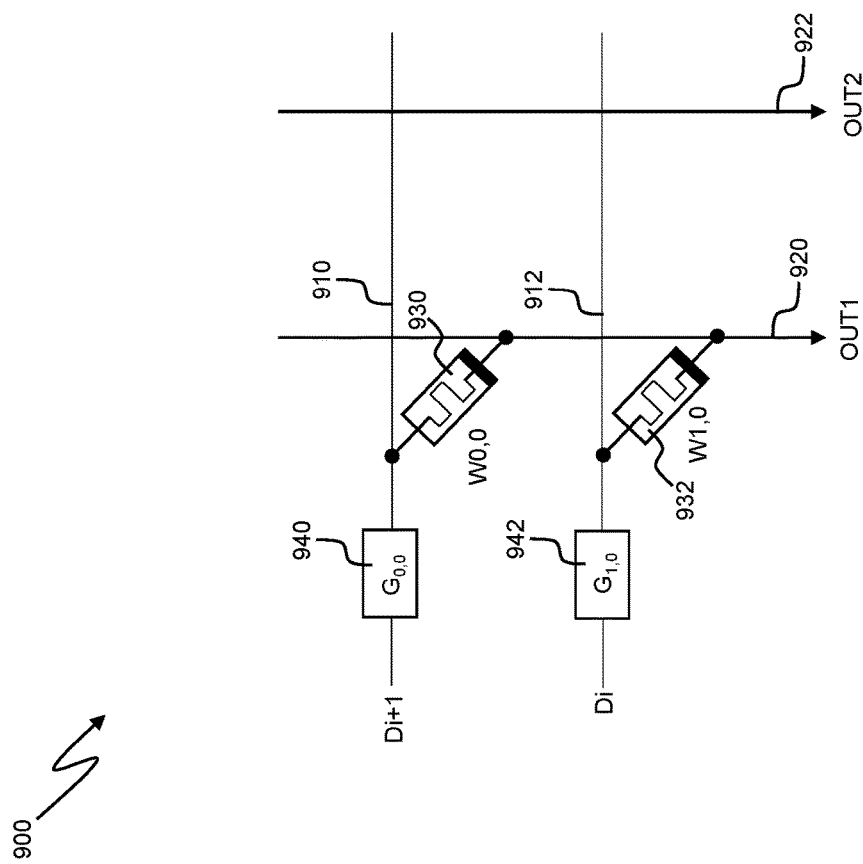

FIGS. 9a-9c schematically illustrate a time sequence for operation of a crossbar array when a weight-dependent compensating term is applied to input data signals to compensate for error in weights stored in the computation elements of the crossbar array.

FIG. 9a shows a 2×2 crossbar array (which may be part of a larger crossbar array) having first and second row electrodes 910, 912 which overlap with first and second column electrodes 920, 922. A first computation element 930 storing a first weight W0,0 couples the first row electrode 910 to the first column electrode 920. A second computation element 932 storing a second weight W1,0 couples the second row electrode 912 to the first column electrode 920. A third computation element 934 storing a third weight W0,1 couples the first row electrode 910 to the second column electrode 922 and a fourth computation element 936 storing a fourth weight W1,1 couples the second row electrode 912 to the second column electrode 922. The computation elements 930, 932, 934, 936 may be, for example, memristors or other memristive elements or programmable-resistance memory components of the kind described above.

The first row electrode 910 is coupled to a first data input of the crossbar array 900 via a first compensating term unit 940. The first compensating term unit 940 is configured to apply a compensating term to a digital input data signal Di+1 received at the first data input to compensate for errors in the weight values stored in the first and third computation elements 930, 934. Similarly, the second row electrode 912 is coupled to a second data input of the crossbar array 900 via a second compensating term unit 942. The second compensating term unit 942 is configured to apply a compensating term to a digital input data signal Di received at the second data input to compensate for errors in the weight values stored in the second and fourth computation elements 932, 936.

As explained above, the compensating terms to be applied to the digital input data signals are dependent at least in part upon the weight values stored in each of the computation elements 930, 932, 934, 936. Thus, the compensating term to be applied to compensate for an error in the weight value stored in the first computation element 930 may be different from the compensating term to be applied to compensate for an error in the weight value stored in the third computation element 934. Similarly, the compensating term to be applied to compensate for an error in the weight value stored in the second computation element 932 may be different from the compensating term to be applied to compensate for an error in the weight value stored in the fourth computation element 936. As a result, the outputs OUT1 and OUT2 of the crossbar array 900 cannot be calculated simultaneously, and instead must be calculated sequentially, as will now be described with reference to FIGS. 9B and 9C.

In a first step in a sequence (e.g. on a first clock pulse), illustrated in FIG. 9b, the output OUT1 is calculated. The first compensating term unit 940 is programmed or otherwise configured with a first compensating term value $G_{0,0}$ calculated as described above to compensate for an error in the weight value W0,0 stored in the first computation element 930. Similarly, the second compensating term unit 942 is programmed or otherwise configured with a second compensating term value $G_{1,0}$ calculated as described above to compensate for an error in the weight value W1,0 stored in the second computation element 932. The first and second compensating terms are thus applied to the digital input data signals Di+1 and Di received, respectively, at the first and second data inputs of the crossbar array 900, and the results of the computations performed by the first and second computation elements 930, 932 are combined to generate the output signal OUT1 in the manner described above with reference to FIG. 2.

Thus, the output signal OUT1 represents the sum of the product of the $G_{0,0}$ compensated first digital input data signal value and the weight value W0,0 and the product of the $G_{1,0}$ compensated second digital input data signal value and the weight value W1,0, i.e. the dot product of the first and second compensated digital data input values and the weight values W0,0, W0,1.

In a second step in the sequence (e.g. on a second clock pulse), illustrated in FIG. 9c, the output OUT2 is calculated. The first compensating term unit 940 is programmed or otherwise configured with a third compensating term value $G_{0,1}$ calculated as described above to compensate for an error in the weight value W0,1 stored in the third computation element 934. Similarly, the second compensating term unit 942 is programmed or otherwise configured with a fourth compensating term value $G_{1,1}$ calculated as described above to compensate for an error in the weight value W1,1 stored in the fourth computation element 936. The third and fourth compensating terms are thus applied to the digital input data signals Di+1 and Di received, respectively, at the first and second data inputs of the crossbar array 900, and the results of the computations performed by the third and fourth computation elements 934, 936 are combined to generate the output signal OUT2 in the manner described above with reference to FIG. 2.

Thus, the output signal OUT2 represents the sum of the product of the $G_{0,1}$ compensated first digital input data signal value and the weight value W0,1 and the product of the $G_{1,1}$ compensated second digital input data signal value and the weight value W1,1, i.e. the dot product of the first and second compensated digital data input values and the weight values W0,1, W1,1.

In the above-described scheme the output signals OUT1 and OUT2 are generated sequentially, but it will be appreciated that when the output signal OUT1 is being generated, a signal will also be present at the output terminal of the second column electrode 922, representing the sum of the product of the $G_{0,0}$ compensated first digital input data signal value and the weight value W0,1 and the product of the $G_{1,0}$ compensated second digital input data signal value and the weight value W1,1. Similarly, when the output signal OUT2 is being generated, a signal will also be present at the output terminal of the first column electrode 920, representing the sum of the product of the $G_{0,1}$ compensated first digital input data signal value and the weight value W0,0 and the product of the $G_{1,1}$ compensated second digital input data signal value and the weight value W0,1.

In order to prevent such signals from giving rise to errors in systems or subsystems downstream of the analog neural network system, circuitry may be provided to disable the column electrode 920, 922 which is not currently being used to provide an output signal OUT1, OUT 2. Such disabling circuitry may be configured to hold the unused column electrode(s) at a reference voltage, for example. Alternatively, such disabling circuitry may include in-line switches or column electrode switches that can be opened to decouple the unused column electrode(s) from the downstream systems or subsystems.

The embodiments described above with reference to FIGS. 3-10 refer to compensating for error in the weights stored in computation elements, but it will be appreciated by those skilled in the art that the error E calculated in the manner described above will also encompass error contributions from other sources, e.g. error arising from gain error or offset error in DACs or ADCs associated with the computation elements and used to convert input and output data between digital and analog formats and vice versa, and thus any compensating term will also compensate for such error contributions.

FIG. 10 is a schematic representation of a device in which an analog neural network system of the kind described above may be provided. The device, shown generally at 1000 in FIG. 10, may be an edge device such as a mobile telephone, tablet or laptop computer, IoT device or the like. The device 1000 includes a processing unit 1010, embodied on one or more integrated circuits, which may be, for example, an application processor. The device further includes memory 1020 communicatively coupled to the processing unit 1010, and a communications subsystem 1030 which is also communicatively coupled to the processing unit 1010 to permit the device 1000 to communicate with systems and devices external to the device 1000. The device further includes an integrated circuit 1050 that implements an analog neural network system 300, 400, 500, 600, 700, 800, 900 of the kind described above with reference to FIGS. 3-9. The integrated circuit 1050 is communicatively coupled to the processing unit 1010 for receiving input data from and transmitting output data to the processing unit 1010.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A neural network system comprising:
a data input configured to receive an input data signal;
analog neural network circuitry operative to apply a weight to a signal received at its input to generate a weighted output signal; and
compensation circuitry configured to:
receive the input data signal;
apply a compensating term to the input data signal to compensate for error in the analog neural network circuitry; and
output a compensated data signal to the analog neural network circuitry.

2. A neural network system according to claim 1 wherein the error in the analog neural network circuitry is at least partly based on an error in a value of a weight stored by the analog neural network circuitry, and wherein the compensating term applied by the compensation circuitry is based at least in part upon the weight stored by the analog neural network.

3. A neural network system according to claim 1 wherein the compensating term applied by the compensation circuitry is based at least in part upon a measured error in a weight stored by the analog neural network circuitry.

4. A neural network system according to claim 1 wherein the error in the analog neural network circuitry is at least partly based on an error in digital to analog conversion circuitry or an error in analog to digital conversion circuitry of the analog neural network circuitry.

5. A neural network system according to claim 4 wherein the error comprises a gain error or an offset error.

6. A neural network system according to claim 1 wherein the input data signal is a digital signal.

7. A neural network system according to claim 1 wherein the compensation circuitry comprises digital circuitry.

8. A neural network system according to claim 1 wherein the compensation circuitry is configured to apply the compensating term to the input data signal and to output a compensated signal to the input of the neural network circuitry.

9. A neural network system according to claim 1 wherein the compensation circuitry is configured to add the compensating term to the input data signal.

10. A neural network system according to claim 1 wherein the compensation circuitry is configured to multiply the input data signal by the compensating term.

11. A neural network system according to claim 7 wherein the compensation circuitry comprises:
   a shift register operative to apply a binary shift to the signal received at the data input of the neural network system; and
   an adder operative to add a binary shifted version of the input data signal that is output by the shift register to the input data signal and to output a signal representing the result of the addition to the analog neural network circuitry.

12. A neural network system according to claim 7 wherein the compensation circuitry comprises:
   a plurality of shift registers arranged in parallel, each of the plurality of shift registers being operative to apply a different binary shift to the signal received at the data input of the neural network system; and
   one or more adders operative to add binary shifted versions of the input data signal that are output by the plurality of shift registers to the input data signal and to output a signal representing the result of the addition to the analog neural network circuitry.

13. A neural network system according to claim 5 wherein the compensation circuitry is configured to apply a compensating term based on a quantisation of an ideal compensating term.

14. A neural network system according to claim 1 wherein the compensation circuitry comprises a selector configured to apply the compensating term to the input data signal selectively.

15. A neural network system according to claim 1 wherein the analog neural network circuitry comprises a crossbar array comprising:
   a plurality of row electrodes, each of the plurality of row electrodes having a respective input terminal;
   a plurality of column electrodes, each of the plurality of column electrodes having a respective output terminal; and
   a plurality of computation elements,
   wherein each of the plurality of computation elements is coupled to one of the plurality of row electrodes and to one of the plurality of column electrodes, and is configured to output a signal representative of the product of a value of a signal received at the input terminal of the row electrode to which it is coupled and a weight value associated with the computation element, and
   wherein the compensation circuitry comprises a plurality of programmable compensation units, each having an output coupled to a respective one of the plurality of row electrodes, each compensation unit being configured to receive a respective data input signal and to apply a respective compensating term to the data input signal.

16. A neural network system according to claim 15 wherein the neural network system is configured to generate output signals at the output of the column electrodes sequentially on a per-column electrode basis, wherein:
   the output signals represent dot products of compensated data signals output by the plurality of programmable compensation units and weight values stored in the computation elements coupled to the column electrode whose output is being calculated; and
   the compensation circuitry is configured to sequentially program the plurality of programmable compensation units with sets of compensating terms, each compensating term being dependent at least in part on a weight stored in a computation element that is coupled to the column electrode whose output is being calculated and to the row electrode to which the respective programmable compensation unit is coupled.

17. A neural network system according to claim 15 wherein the crossbar array comprises a plurality of memristive elements or programmable-resistance memory components.

18. An integrated circuit comprising a neural network system according to claim 1.

19. A device comprising an integrated circuit according to claim 18.

20. A device according to claim 19, wherein the device is a mobile telephone, a tablet or laptop computer or an Internet of Things (IoT) device.

21. An analog neural network system comprising:
   a crossbar array comprising:
      first and second row electrodes, the first row electrode having a first signal input terminal and the second row electrode having a second signal input terminal;
      first and second column electrodes, the first column electrode having a first signal output terminal and second column electrode having a second signal output terminal;
      a first analog computation element coupled to the first row electrode and the first column electrode, the first analog computation element being operative to apply a first weight to a first input signal received at the first signal input terminal;
      a second analog computation element coupled to the second row electrode and the first column electrode, the second analog computation element being operative to apply a second weight to a second input signal received at the second signal input terminal;
      a third analog computation element coupled to the first row electrode and the second column electrode, the third analog computation element being operative to apply a third weight to a third input signal received at the first signal input terminal;

a fourth analog computation element coupled to the second row electrode and the second column electrode, the fourth analog computation element being operative to apply a fourth weight to a fourth input signal received at the second signal input terminal;

wherein the analog neural network system further comprises:

a first configurable compensation unit having an input for receiving a first input data signal and an output coupled to the first signal input terminal; and a second configurable compensation unit having an input for receiving a second input data signal and an output coupled to the second signal input terminal; and wherein the analog neural network system is operative to:

program the first and second configurable compensation units with respective first and second compensation terms and generate a first output signal at the first signal output terminal, the first output signal being based on:

the product of a compensated data input signal output by the first configurable compensation unit and a weight value stored in the first analog computation element; and the product of a compensated data input signal output by the second configurable compensation unit and a weight value stored in the second analog computation element; and subsequently program the first and second configurable compensation units with respective third and fourth compensation terms and generate a second output signal at the second signal output terminal, the second output signal being based on:

the product of a compensated data input signal output by the first configurable compensation unit and a weight value stored in the third analog computation element; and the product of a compensated data input signal output by the second configurable compensation unit and a weight value stored in the fourth analog computation element.

* * * * *